(12) United States Patent
Ye et al.

(10) Patent No.: US 8,916,895 B2
(45) Date of Patent: Dec. 23, 2014

(54) INFRARED LIGHT-EMITTING DIODE AND TOUCH SCREEN

(75) Inventors: Xinlin Ye, Beijing (CN); Zhenzhong Zou, Beijing (CN); Jianjun Liu, Beijing (CN); Xinbin Liu, Beijing (CN)

(73) Assignee: Beijing IRTouch Systems Co., Ltd, Beijing (CN)

( * ) Notice: Subject to any disclaimer, the term of this patent is extended or adjusted under 35 U.S.C. 154(b) by 0 days.

(21) Appl. No.: 13/702,832

(22) PCT Filed: Jun. 9, 2011

(86) PCT No.: PCT/CN2011/075508
§ 371 (c)(1),
(2), (4) Date: Dec. 7, 2012

(87) PCT Pub. No.: WO2011/153947
PCT Pub. Date: Dec. 15, 2011

(65) Prior Publication Data
US 2013/0075765 A1  Mar. 28, 2013

(30) Foreign Application Priority Data
Jun. 9, 2010  (CN) .......................... 2010 1 0201781

(51) Int. Cl.
*H01L 33/10* (2010.01)
*H01L 33/12* (2010.01)
*H01L 31/12* (2006.01)
*F21V 5/04* (2006.01)
*G06F 3/042* (2006.01)
*H01L 33/54* (2010.01)

(52) U.S. Cl.
CPC .............. *H01L 33/10* (2013.01); *H01L 31/125* (2013.01); *F21V 5/045* (2013.01); *G06F 3/0421* (2013.01); *H01L 33/54* (2013.01)

USPC ........ 257/98; 257/82; 257/E33.073; 362/245; 362/309; 362/335

(58) Field of Classification Search
CPC ........... H01L 33/58; H01L 33/54; F21V 5/04; F21V 5/045; G02B 3/08
USPC ............. 257/98, E33.073, E33.067; 362/245, 362/307, 309, 311.02, 311.06, 327
See application file for complete search history.

(56) References Cited

U.S. PATENT DOCUMENTS

| 5,122,943 A | 6/1992 | Pugh |
| 6,048,083 A * | 4/2000 | McDermott ................... 362/337 |
| 2009/0052190 A1* | 2/2009 | Shimada ................... 362/296.05 |
| 2011/0044037 A1* | 2/2011 | Scordino et al. .............. 362/235 |

FOREIGN PATENT DOCUMENTS

CN  101382859  3/2009

* cited by examiner

*Primary Examiner* — Tom Thomas
*Assistant Examiner* — John Bodnar
(74) *Attorney, Agent, or Firm* — Harness, Dickey & Pierce, P.L.C.

(57) ABSTRACT

This invention discloses an infrared light-emitting diode. The infrared light-emitting diode comprises: only one core for emitting infrared light; a packaging body which at least comprises a first surface that is convex and in front of the core and a second surface that is plane and on one side of the core; and leads connected to the core and extending to outside of the packaging body; wherein the infrared light emitted by the core forms at least two beams of infrared light in different directions after being emitted from the packaging body through the first surface and the second surface. With such infrared LED and the touch screen, touch system and interactive display based on the LED, at least two beams of infrared light in different directions can be emitted requiring only one core.

15 Claims, 8 Drawing Sheets

INFRARED LIGHT-EMITTING DIODE AND TOUCH SCREEN

TECHNICAL FIELD OF THE INVENTION

The present invention relates to the field of photoelectric technology, and particularly to an infrared light-emitting diode and a touch screen based on the same.

BACKGROUND OF THE INVENTION

The infrared light-emitting diode is a common infrared element, and it is widely used in the field of touch screen as a positioning apparatus or a light source. The existing infrared light-emitting diode generally emits one beam of infrared light; for infrared light-emitting diode emitting two beams of infrared light, usually two cores are employed which cause a high cost. Therefore, the industry is in need of an infrared light-emitting diode by which at least two beams of infrared light can be emitted requiring only one core.

SUMMARY OF THE INVENTION

According to the problem existing in the prior art, the present invention provides an infrared light-emitting diode by which at least two beams of infrared light in different directions can be emitted requiring only one core; the present invention provides a touch screen in which an infrared light-emitting diode can emit at least two beams of infrared light in different directions requiring only one core; the present invention provides a touch system in which an infrared light-emitting diode in the touch screen thereof can emit at least two beams of infrared light in different directions requiring only one core; the present invention also provides an interactive display in which an infrared light-emitting diode in the touch screen thereof can emit at least two beams of infrared light in different directions requiring only one core.

An infrared light-emitting diode comprises:

a core for emitting infrared light, the number of the core being one;

a packaging body outside the core, the packaging body at least comprising a first surface and a second surface, the first surface being convex and in front of the core, and the second surface being plane and on one side of the core; and leads connected with the core and extending to outside of the packaging body;

wherein the infrared light emitted by the core forms at least two beams of infrared light in different directions after being emitted from the packaging body at least through the first surface and the second surface.

Alternatively, the at least two beams of infrared light in different directions comprise infrared light in a first direction and infrared light in a second direction;

a part of the infrared light emitted by the core forms the infrared light in the first direction after being refracted through the first surface;

a part of the infrared light emitted by the core is full-reflected at the second surface and emitted toward the first surface, and forms the infrared light in the second direction after being refracted through the first surface.

Alternatively, the packaging body further has a third surface that is plane, wherein the third surface and the second surface are located on two sides of the core respectively.

Alternatively, the packaging body further has a fourth surface that is located between the first surface and the second surface/or the third surface, wherein the infrared light incident on the second surface or the third surface and full-reflected by the same is emitted from the packaging body after being refracted through the fourth surface.

Alternatively, the at least two beams of infrared light in different directions comprises two beams of infrared light in a first direction and a beam of infrared light in a second direction;

a part of the infrared light emitted by the core forms a beam of the infrared light in the first direction after being refracted through the first surface;

a part of the infrared light emitted by the core is full-reflected at the third surface and emitted toward the fourth surface, and forms another beam of the infrared light in the first direction after being refracted through the fourth surface; and a part of the infrared light emitted by the core is full-reflected at the second surface and emitted toward the first surface, and forms the infrared light in the third direction after being refracted through the first surface.

Alternatively, the at least two beams of infrared light in different directions comprises two beams of infrared light in a first direction and a beam of infrared light in a third direction;

a part of the infrared light emitted by the core forms a beam of the infrared light in the first direction after being refracted through the first surface;

a part of the infrared light emitted by the core is full-reflected at the second surface and emitted toward the fourth surface, and forms another beam of the infrared light in the first direction after being refracted through the fourth surface; and a part of the infrared light emitted by the core is full-reflected at the third surface and emitted toward the first surface, and forms the infrared light in the third direction after being refracted through the first surface.

Alternatively, the at least two beams of infrared light in different directions at least comprises infrared light in a first direction and infrared light in a third direction;

a part of the infrared light emitted by the core forms the infrared light in the first direction after being refracted through the first surface;

a part of the infrared light emitted by the core is full-reflected at the third surface and emitted toward the first surface, and forms the infrared light in the third direction after being refracted through the first surface.

Alternatively, the at least two beams of infrared light in different directions at least comprises infrared light in a first direction, infrared light in a second direction and infrared light in a third direction;

a part of the infrared light emitted by the core forms the infrared light in the first direction after being refracted through the first surface;

a part of the infrared light emitted by the core is full-reflected at the second surface and emitted toward the first surface, and forms the infrared light in the second direction after being refracted through the first surface; and a part of the infrared light emitted by the core is full-reflected at the third surface and emitted toward the first surface, and forms the infrared light in the third direction after being refracted through the first surface.

Alternatively, the angle between the infrared light in the first direction and the infrared light in the third direction is equal to the angle between the infrared light in the second direction and the infrared light in the third direction.

Alternatively, a reflecting layer and/or a light absorbing layer is/are set outside the second surface and/or the third surface.

Alternatively, optical axis of the core is not parallel to the second surface and/or the third surface.

A touch screen comprises an infrared receiving diode, a touch detecting area, a processing circuit and the infrared light-emitting diode as mentioned above, wherein at least two beams of infrared light in different directions formed by the infrared light-emitting diode are received by the infrared receiving diode after passing through the touch detecting area.

Alternatively, the touch screen further comprises a frame within which the touch detecting area is located, and the infrared light-emitting diode and the infrared receiving diode are installed on frame edges of the frame; the touch screen comprises a set of infrared light-emitting diodes and a set of infrared receiving diodes, and the set of infrared light-emitting diodes and the set of infrared receiving diodes are installed on two opposite frame edges of the frame respectively.

Alternatively, the touch screen further comprises a frame within which the touch detecting area is located, the infrared light-emitting diode and the infrared receiving diode are installed on frame edges of the frame; the touch screen comprises two sets of infrared light-emitting diodes and two sets of infrared receiving diodes, and one set of infrared light-emitting diodes in the two sets of infrared light-emitting diodes and one set of infrared receiving diodes in the two sets of infrared receiving diodes are installed on two opposite frame edges of the frame respectively while the other set of infrared light-emitting diodes in the two sets of infrared light-emitting diodes and the other set of infrared receiving diodes in the two sets of infrared receiving diodes are installed on the other two opposite frame edges of the frame respectively.

The present invention provides a touch system which comprises the touch screen as mentioned above.

The present invention provides an interactive display which comprises the touch screen as mentioned above.

In comparison with the prior art, the infrared light-emitting diode provided in the present invention and the touch screen, touch system and interactive display provided based on the infrared light-emitting diode have the following advantages:

The present invention improves structure of the packaging body within the infrared light-emitting diode, so that it has a plurality of surfaces comprising a first surface and a second surface, the first surface being convex and in front of the core, and the second surface being plane and on one side of the core; a part of the infrared light emitted by the core forms the infrared light in a first direction after being refracted through the first surface, and a part of the infrared light emitted by the core is full-reflected at the second surface and emitted toward the first surface, and forms the infrared light in a second direction after being refracted through the first surface, which thus makes it possible that at least two beams of infrared light in different directions are emitted requiring only one core.

Other aspects and/or advantages of the present invention will be described partially in the following description, and a part thereof is obvious in the description, or can be learnt in praxis of the present invention.

BRIEF DESCRIPTION OF THE DRAWINGS

The present invention will be understood better by reading the following detailed description with reference to the following figures. It shall be noted, respective details are not drawn in proportion. To the contrary, the respective details are zoomed in and out in any degree in order to make them clear, wherein.

DETAILED DESCRIPTION OF THE PREFERRED EMBODIMENTS

Next, the embodiments of the present invention will be described in detail according to corresponding accompanying drawings, wherein the same reference signs in the whole text indicate the same elements. The invention will be described by way of examples in conjunction with accompanying drawings as follow.

Figure 1:
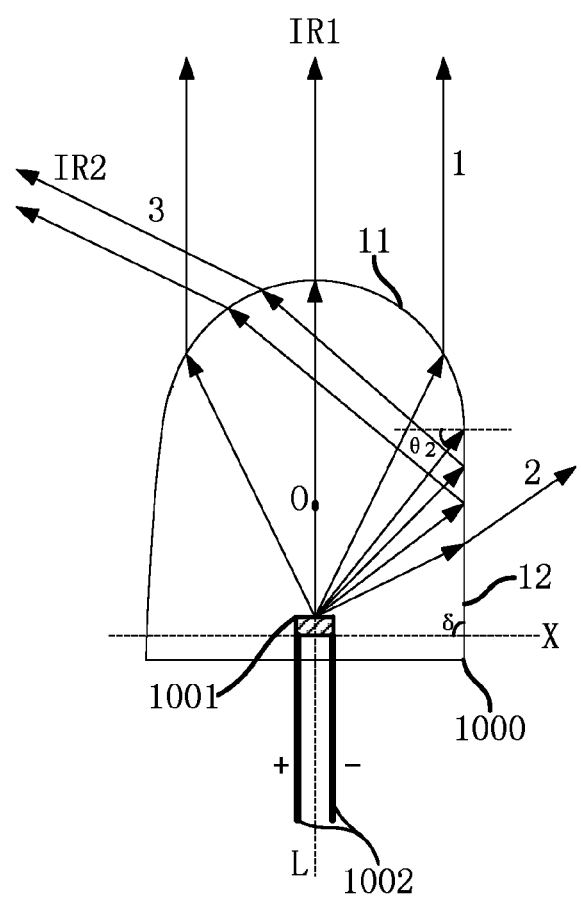
FIG. 1 is a structure diagram of a first embodiment of the infrared light-emitting diode according to the present invention.

As shown in FIG. 1, in the first embodiment of the infrared light-emitting diode according to the present invention, the infrared light-emitting diode comprises a core 1001 for emitting infrared light, number of the core 1001 being one; a packaging body 1000 outside the core 1001, the packaging body 1000 at least comprising a first surface 11 and a second surface 12, which means that the packaging body 1000 has a plurality of surfaces at least comprising a first surface 11 and a second surface 12, the first surface 11 being convex and in front of the core 1001, and the second surface 12 being plane and on one side of the core 1001 (in FIG. 1, the second surface 12 is located on the right side of the core 1001; in other embodiments, it may be located on the left side, the upper side (outwards in the direction perpendicular to paper plane) or the underside (inwards in the direction perpendicular to paper plane) of the core 1001); and leads 1002 connected to the core 1001 and extending to outside of the packaging body 1000, wherein there are two leads 1002 which are connected to positive and negative poles of the core 1001 respectively (shown as "+" and "−" in FIG. 1). After being emitted from the packaging body, the infrared light emitted by the core 1001 forms at least two beams of infrared light in different directions: one beam of infrared light is infrared light IR1 in a first direction and the other beam of infrared light is infrared light IR2 in a second direction; a part of infrared light emitted from the core 1001 directly toward the first surface 11 (such as light 1 shown in FIG. 1) forms the infrared light IR1 in the first direction after being refracted through the first surface 11 (since the first surface 11 is convex, it plays the role as a convex lens); in the infrared light emitted from the core 1001 toward the second surface 12, a part of the infrared light (such as light 2 shown in FIG. 1) is emitted toward outside of the packaging body after being refracted through the second surface 12, and a part of the infrared light (such as light 3 shown in FIG. 1) is full-reflected at the second surface 12 when the maximal incidence angle of the infrared light incident on the second surface 12, i.e. $\theta_2$, meets the formula of $\theta_2 >$ arcsin 1/n (n indicates refraction index of the packaging body 1000 for infrared light), then emitted toward the first surface 11, and forms the infrared light IR2 in the second direction after being refracted through the first surface 11 (since the first surface 11 is convex, it plays the role as a convex lens).

The core 1001 may be a LED chip, and the packaging body 1000 may be a solid medium which at least allows infrared light to pass through, such as glass and epoxy resin etc; as a preference, the focus O of the first surface 11 of the packaging body 1000 is located in the straight line L of the optical axis of the core 1001.

Furthermore, maximal incidence angle $\theta_2$ of the infrared light incident on the second surface 12 can be achieved by selecting optically transparent mediums with different refraction indexes for infrared light to manufacture the packaging body 1000, adjusting the angle $\delta$ between the second surface 12 and light-emitting surface X of the core 1001 (which means adjusting the angle between the optical axis L of the core and the second surface 12, where the optical axis may be or may not be parallel to the second surface 12), and it may also be achieved by setting in partial areas of the second surface 12 a reflecting layer, which may be implemented as a reflecting mirror, a metal layer, an electroplating metal layer and a mirror coating. Meanwhile, a light absorbing layer, which may be a black coating, may be set in partial areas of the second surface so that light can be neither reflected nor refracted in the areas.

It shall be noted that the first embodiment of the infrared light-emitting diode according to the present invention only describes in detail that the packaging body 1000 has a first surface 11 being convex and a second surface 12 being plane, which means the effect that at least two beams of infrared light in different directions can be emitted with only one core in the first embodiment of the infrared light-emitting diode according to the present invention must be based on the solution that the packaging body 1000 has two basic structure features of the first surface 11 and the second surface 12; nevertheless, the packaging body in the first embodiment of the infrared light-emitting diode according to the present invention may further have one or more surfaces in other forms which can be deduced based on the present invention by those skilled in the art.

Figure 2:
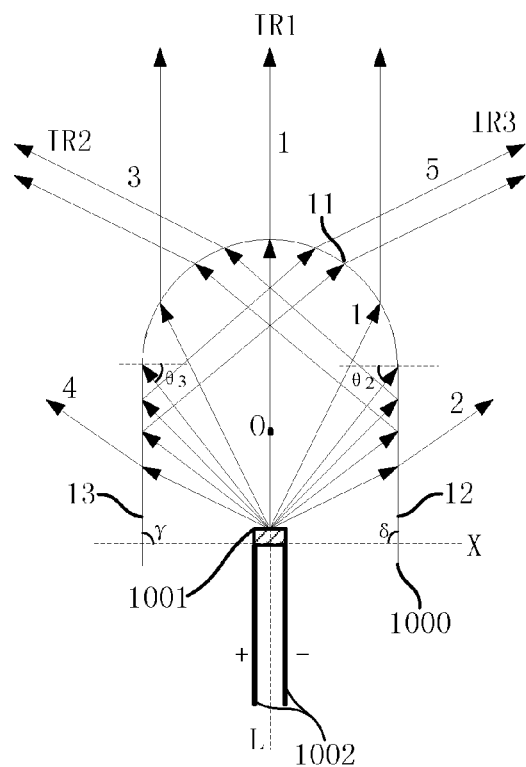
FIG. 2 is a structure diagram of a second embodiment of the infrared light-emitting diode according to the present invention.

As shown in FIG. 2, in the second embodiment of the infrared light-emitting diode according to the present invention, the infrared light-emitting diode comprises a core 1001 for emitting infrared light, number of the core 1001 being one; a packaging body 1000 outside the core 1001, the packaging body 1000 having a plurality of surfaces at least comprising a first surface 11, a second surface 12 and a third surface 13, the first surface 11 being convex and in front of the core 1001, and the second surface 12 and the third surface 13 being plane and on two sides of the core 1001 (in FIG. 2, the second surface 12 is located on the right side of the core 1001 and the third surface 13 is located on the left side of the core 1001; in other embodiments, the second surface 12 and the third surface 13 may be located on the upper side (outwards in the direction perpendicular to paper plane) or the underside (inwards in the direction perpendicular to paper plane) of the core 1001); and leads 1002 connected to the core 1001 and extending to outside of the packaging body 1000, wherein there are two leads 1002 which are connected to positive and negative poles of the core 1001 respectively (shown as "+" and "−" in FIG. 2). After being emitted from the packaging body, the infrared light emitted by the core 1001 forms three beams of infrared light in different directions at least comprising infrared light IR1 in a first direction, infrared light IR2 in a second direction and infrared light IR3 in a third direction. A part of infrared light (such as light 1 shown in FIG. 2) emitted from the core 1001 directly toward the first surface 11 forms the infrared light IR1 in the first direction after being refracted through the first surface 11 (since the first surface 11 is convex, it plays the role as a convex lens); in the infrared light emitted from the core 1001 toward the second surface 12, a part of the infrared light (such as light 2 shown in FIG. 2) is emitted toward outside of the packaging body after being refracted through the second surface 12, and a part of the infrared light (such as light 3 shown in FIG. 2) is full-reflected at the second surface 12 when the maximal incidence angle of the infrared light incident on the second surface 12, i.e. $\theta_2$, meets the formula of $\theta_2 >$ arcsin 1/n (n indicates refraction index of the packaging body 1000 for infrared light), then emitted toward the first surface 11, and forms the infrared light IR2 in the second direction after being refracted through the first surface 11 (since the first surface 11 is convex, it plays the role as a convex lens); in the infrared light emitted from the core 1001 toward the third surface 13, a part of the infrared light (such as light 4 shown in FIG. 2) is emitted toward outside of the packaging body after being refracted through the third surface 13, and a part of the infrared light (such as light 5 shown in FIG. 2) is full-reflected at the third surface 13 when the maximal incidence angle of the infrared light incident on the third surface 13, i.e. $\theta_3$, meets the formula of $\theta_3 >$ arcsin 1/n (n indicates refraction index of the packaging body 1000 for infrared light), then emitted toward the first surface 11, and forms the infrared light IR3 in the third direction after being refracted through the first surface 11 (since the first surface 11 is convex, it plays the role as a convex lens).

The core 1001 may be a LED chip, and the packaging body 1000 may be a solid medium which at least allows infrared light to pass through, such as glass and epoxy resin etc; as a preference, the focus O of the first surface 11 of the packaging body 1000 is located in the straight line L of the optical axis of the core 1001.

Furthermore, maximal incidence angle $\theta_2$ of the infrared light incident on the second surface 12 and maximal incidence angle $\theta_3$ of the infrared light incident on the third surface 13 can be achieved by selecting optically transparent mediums with different refraction indexes for infrared light to manufacture the packaging body 1000, adjusting the angle $\delta$ between the second surface 12 and light-emitting surface X of the core 1001 (which means adjusting the angle between the optical axis L of the core and the second surface 12, where the optical axis may be or may not be parallel to the second surface 12), adjusting the angle $\gamma$ between the third surface 13 and light-emitting surface X of the core 1001 (which means adjusting the angle between the optical axis L of the core and the third surface 13, where the optical axis may be or may not be parallel to the third surface 13), and may also be achieved by setting in partial areas of the second surface 12 a reflecting layer which may be implemented as a reflecting mirror, a metal layer, an electroplating metal layer and a mirror coating. Meanwhile, a light absorbing layer, which may be a black coating, may be set in partial areas of the second surface so that light can be neither reflected nor refracted in the areas. By adjustment of $\theta_2$, $\theta_3$, $\delta$, and $\gamma$ as well as application of the reflecting layer and light absorbing layer, the infrared light-emitting diode according to the second embodiment of the present invention can be set to be able to only emit infrared light in the first direction and infrared light in the second direction, or only emit infrared light in the first direction and infrared light in the third direction. It shall be noted that the second embodiment of the infrared light-emitting diode according to the present invention only describes in detail that the packaging body 1000 has a first surface 11 being convex, a second surface 12 and a third surface 13 being plane, which means the effect that at least three beams of infrared light in different directions can be emitted with only one core in the second embodiment of the infrared light-emitting diode according to the present invention must be based on the solution that the packaging body 1000 has three basic structure features of the first surface 11, the second surface 12 and the third surface 13; nevertheless, the packaging body in the second embodiment of the infrared light-emitting diode according to the present invention may further have one or more surfaces in other forms which can be deduced based on the present invention by those skilled in the art.

Figure 3:
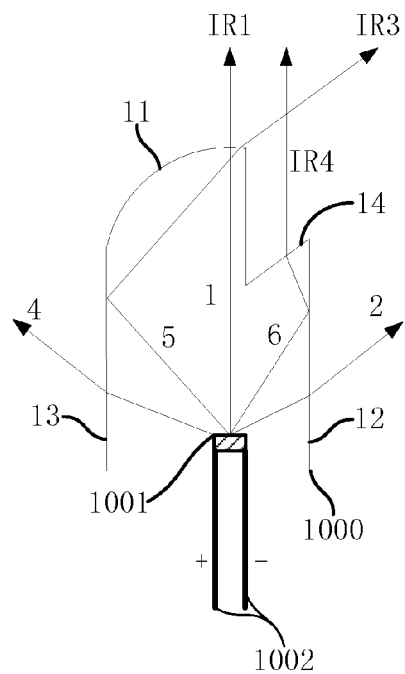
FIG. 3 is a structure diagram of a third embodiment of the infrared light-emitting diode according to the present invention.

As shown in FIG. 3, in the third embodiment of the infrared light-emitting diode according to the present invention, the infrared light-emitting diode comprises a core 1001 for emitting infrared light, number of the core 1001 being one; a packaging body 1000 outside the core 1001, the packaging body 1000 having a plurality of surfaces at least comprising a first surface 11, a second surface 12, a third surface 13 and a fourth surface 14, the first surface 11 being convex and in front of the core 1001, the second surface 12 and the third surface 13 being plane and on two sides of the core 1001 (in FIG. 3, the second surface 12 is located on the right side of the core 1001 and the third surface 13 is located on the left side of the core 1001; in other embodiments, the second surface 12 and the third surface 13 may be located on the upper side (outwards in the direction perpendicular to paper plane) or the underside (inwards in the direction perpendicular to paper plane) of the core 1001), and the fourth surface 14 being plane (in other embodiments, it may also be curve) and located between the first surface 11 and the second surface 12 (in other embodiments, the fourth surface 14 may also be located between the first surface 11 and the third surface 13); and leads 1002 connected to the core 1001 and extending to outside of the packaging body 1000, wherein there are two leads 1002 which are connected to positive and negative poles of the core 1001 respectively (shown as "+" and "−" in FIG. 3). A part of infrared light (such as light 1 shown in FIG. 3) emitted from the core 1001 directly toward the first surface 11 forms the infrared light IR1 in a first direction after being refracted through the first surface 11 (since the first surface 11 is convex, it plays the role as a convex lens); in the infrared light emitted from the core 1001 toward the third surface 13, a part of the infrared light (such as light 4 shown in FIG. 3) is emitted toward outside of the packaging body after being refracted through the third surface 13, and a part of the infrared light (such as light 5 shown in FIG. 3) is emitted toward the first surface 11 after being full-reflected at the third surface 13, and forms the infrared light IR3 in a third direction after being refracted through the first surface 11 (since the first surface 11 is convex, it plays the role as a convex lens); in the infrared light emitted from the core 1001 toward the second surface 12, a part of the infrared light (such as light 2 shown in FIG. 3) is emitted toward outside of the packaging body after being refracted through the second surface 12, and a part of the infrared light (such as light 6 shown in FIG. 3) is full-reflected at the second surface 12, then emitted toward the fourth surface 14, and forms the infrared light IR4 after being refracted through the fourth surface 14 (the fourth surface 14 may be plane or convex). The infrared light IR4 helps to increase light intensity of the infrared light IR1 in the first direction. From the embodiment it can be seen that the infrared light IR1 in the first direction and infrared light IR3 in the third direction can be obtained after the infrared light emitted by the core of the infrared light-emitting diode shown in FIG. 3 passes through the packaging body, and the light intensity of the infrared light in other directions is much weaker than that of the infrared light IR1 in the first direction and infrared light IR3 in the third direction after the infrared light emitted by the core of the infrared light-emitting diode shown in FIG. 3 passes through the packaging body.

Figure 4:
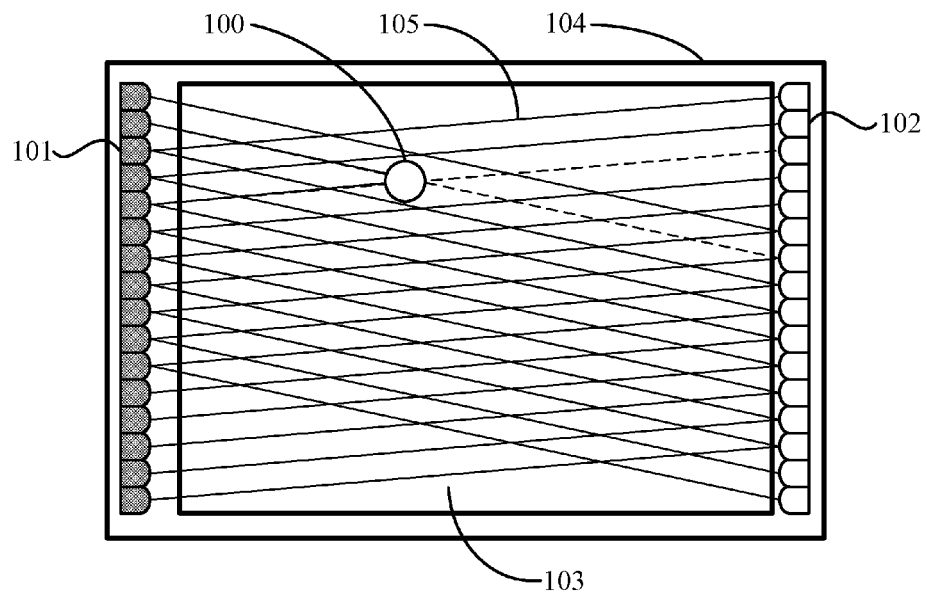
FIG. 4 is a structure diagram of an embodiment of the touch screen according to the present invention.
Figure 5:
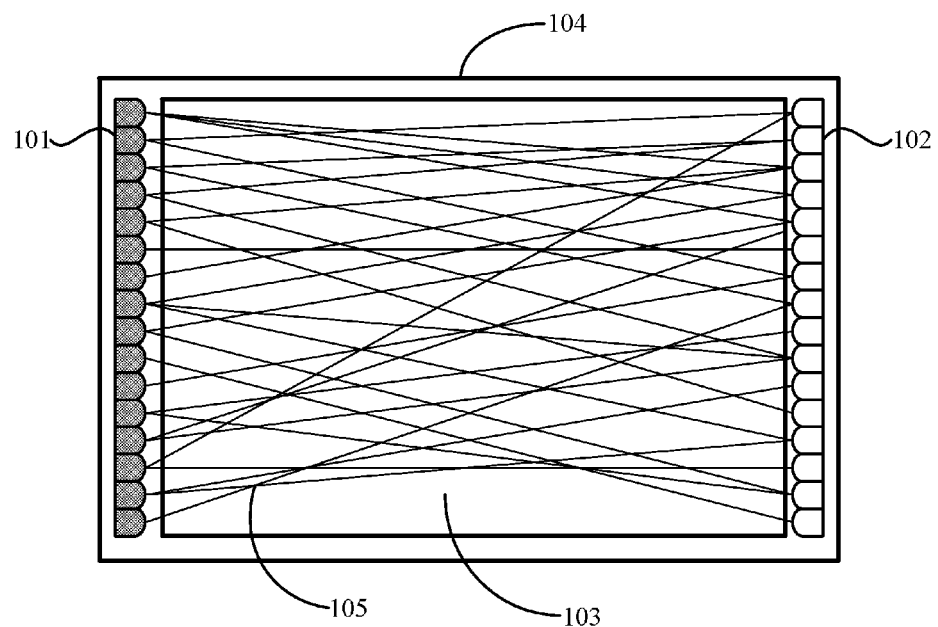
FIG. 5 is a diagram showing a setting manner of infrared light of the infrared touch screen shown in FIG. 4.
Figure 6:
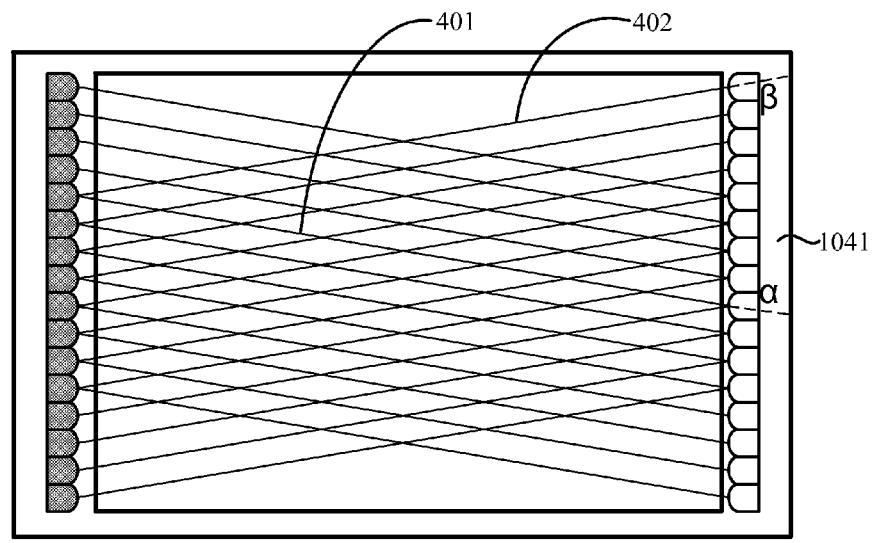
FIG. 6 is a diagram showing another setting manner of infrared light of the infrared touch screen shown in FIG. 4.

FIG. 4 shows a structure diagram of an embodiment of the touch screen according to the present invention. The touch screen comprises a set of infrared light-emitting diodes 101, a set of infrared receiving diodes 102, a touch detecting area 103 and a rectangular frame 104. The set of infrared light-emitting diodes 101 is installed on a frame edge of the rectangular frame 104 and the set of infrared receiving diodes 102 is installed on another frame edge of the rectangular frame 104. The frame edge on which the infrared light-emitting diodes 101 are installed is opposite to the frame edge on which the infrared receiving diodes 102 are installed. At least one of the infrared light-emitting diodes 101 is the infrared light-emitting diode described in the embodiments of infrared light-emitting diodes according to the present invention. The infrared light-emitting diodes 101 emit at least two beams of infrared light 105 in different directions. The infrared light 105 are received by the infrared receiving diodes 102 after passing through the touch detecting area 103 in at least two directions, which means, after the infrared light-emitting diodes 101 emit at least two beams of infrared light 105 in different directions which pass through the touch detecting area 103 in at least two directions, infrared light in each direction is received by an infrared receiving diode 102 (in other words, there might also be an infrared light-emitting diode which can only emit one beam of infrared light in the set of infrared light-emitting diodes 101). All the infrared light 105 form a crossing infrared light grid in the touch detecting area 103. At least two beams of infrared light 105 will be blocked if an object (such as a user's finger, a handwriting pen etc.) 100 taps in the touch detecting area 103. Since positions of the infrared light-emitting diode 101 and the infrared receiving diode 102 corresponding to each beam of infrared light 105 are fixed, according to theorem of similar triangles, position of intersection of any two blocked beams of infrared light 105 which have with different slopes can be calculated easily. Position of the intersection is just the position of the touching object 100. The touch screen of such structure can implement touch positioning requiring only one set of infrared light-emitting diodes and one set of infrared receiving diodes, which greatly reduces number of electronic elements, simplifies the structure and reduces the production costs. The infrared light 105 in such a touch screen is only required to construct a crossing infrared light array which has enough intersections within the touch detecting area 103. The infrared light 105 can be set to construct an unordered crossing infrared array as shown in FIG. 5 in details; distribution of the infrared light 105 can also be set in order, for instance, the infrared light 105 can be set as two sets of parallel infrared light 105 which intersect with one another, and the infrared light 105 in the touch screen in FIG. 4 shows a situation of such a setting manner. In praxis, such a setting manner is employed mostly, for this design is convenient for the mass assembly manufacturing, and reduces detection accuracy decrease resulted from installation angle deviation between infrared light-emitting diodes and infrared receiving diodes. In order to further improve the setting manner, angles formed by the two sets of parallel infrared light 105 and a same frame edge can be set as equal to one another, which can be shown in FIG. 6. As shown in FIG. 6, the angle between a first parallel infrared light 401 and a first frame edge 1041 is α and the angle between a second parallel infrared light 402 and the first frame edge 1041 is β, and ∠α=∠β. This symmetric structure is convenient for installation and improves detection accuracy of the touch screen. Similarly, each of the infrared light-emitting diodes 101 can be configured to emit more beams of infrared light which are received by a bigger number of infrared receiving diodes, which will not be illustrated in detail any more. In praxis, if the touch screen is a large-size touch screen, the infrared light-emitting diodes 101 and infrared receiving diodes 102 are generally installed on two frame edges which have a longer length; if the touch screen is a small-size touch screen, the infrared light-emitting diodes 101 and infrared receiving diodes 102 are generally installed on two frame edges which have a shorter length. The two installation manners reduce costs as much as possible in condition of ensuring detection accuracy; the installation manners are simple, so they will not be illustrated any more. In praxis, the rectangular frame 104 is not necessarily the case; in certain cases, there might be a non-rectangular frame or no frame installed.

Figure 7:
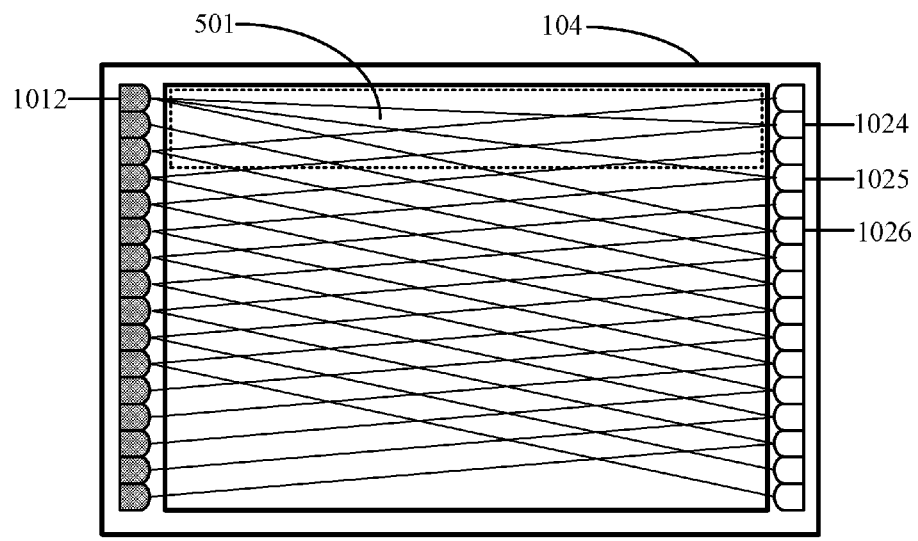
FIG. 7 is a structure diagram of an improved scheme of the infrared touch screen according to an embodiment of the present invention.

FIG. 7 shows a structure diagram of an improved scheme of the touch screen according to an embodiment of the present invention. In the improved scheme, infrared light 105 emitted by the infrared light-emitting diode 1012 at end of the frame can be received by an infrared receiving diode 1024, an infrared receiving diode 1025 and an infrared receiving diode 1026. The improved touch screen according to the improved scheme has more infrared light 105 in frame edge area 501 (shown as dotted area) than the touch screen shown in FIG. 4, and the infrared grid in the frame edge area 501 is also denser, which improves detection accuracy in the frame edge area 501.

Figure 8:
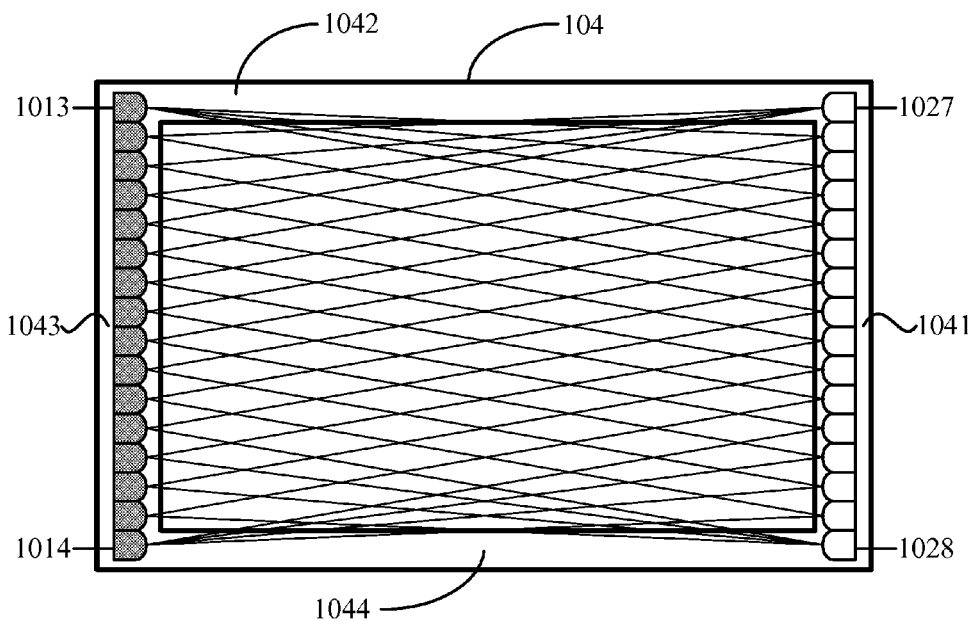
FIG. 8 is a structure diagram of another improved scheme of the infrared touch screen according to an embodiment of the present invention.

FIG. 8 shows a structure diagram of another improved scheme of the touch screen according to an embodiment of the present invention. Four frame edges of the frame 104 are a first frame edge 1041, a second frame edge 1042, a third frame edge 1043 and a fourth frame edge 1044 respectively. The infrared light-emitting diodes 101 and infrared receiving diodes 102 are respectively installed within the first frame edge 1041 and the third frame edge 1043 (the infrared light-emitting diodes 101 and infrared receiving diodes 102 may also be respectively installed within the second frame edge 1042 and the fourth frame edge 1044). In order to further improve detection accuracy in the frame edge area 501, infrared light-emitting diodes 101 at two ends of a set of infrared light-emitting diodes 101 and infrared receiving diodes 102 at two ends of a set of infrared receiving diodes 102 may be installed outside the touch detecting area 103. In other words, the infrared light-emitting diode 1013 and infrared receiving diode 1027 at two ends are installed within the second frame edge 1042, and the infrared light-emitting diode 1014 and infrared receiving diode 1028 are installed within the fourth frame edge 1044. The structure adjustment moves original frame edge area 501 of low detection accuracy to area within the second frame edge 1042 and fourth frame edge 1044, which improves detection accuracy in the touch detecting area 103.

Figure 9:
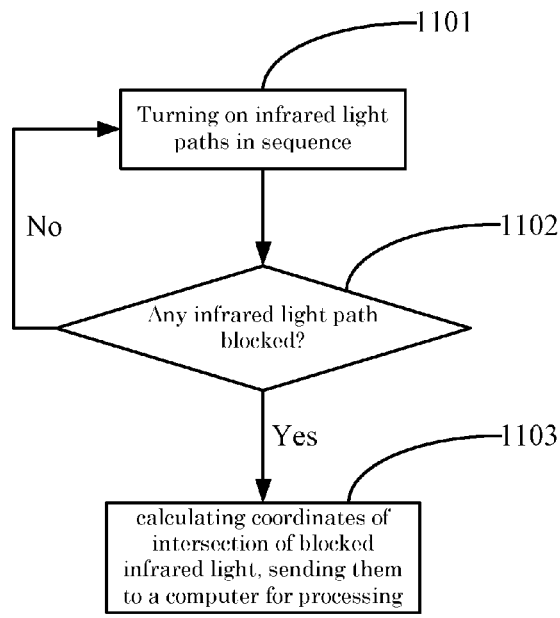
FIG. 9 is a flow chart of a touch positioning method for the infrared touch screen according to an embodiment of the present invention.

FIG. 9 shows a flow chart of a touch positioning method for the touch screen according to an embodiment of the present invention. The touch positioning method comprises the following steps:

entering step 1101, starting the touch screen, and turning on all the predetermined infrared light in sequence.

In step 1101, the infrared light between all the infrared light-emitting diodes and corresponding infrared receiving diodes is turned on in sequence, and a crossing infrared light array (also called as infrared light grid) is thus formed in the touch detecting area.

This step may be performed by the touch screen as shown in FIG. 4, wherein the infrared light-emitting diodes 101 are numbered with $i_1, i_2, i_3 \ldots i_n$, and the infrared receiving diodes 102 are numbered with $r_1, r_2, r_3 \ldots r_n$. The infrared light $i_1 r_p$, $i_2 r_{p+1}, i_3 r_{p+2} \ldots i_{n+1-p} r_n, i_q r_1, i_{q+1} r_2, i_{q+2} r_3 \ldots i_n r_{n+1-q}$ is turned on in sequence, forming a crossing infrared light array in the touch detecting area, where n, p and q are natural numbers, and p<n, q<n.

The process enters into step 1102 of determining whether there is infrared light blocked; if there is no infrared light blocked, returning to step 1101; if there is infrared light blocked, recording the blocked infrared light.

In step 1102, if there is no blocked infrared light, which means that there is no touching object in the touch detecting area, the process returns to step 1101, re-turning on all the infrared light in sequence and detecting the whole touch detecting area; if there is infrared light which are blocked, which means that there is a touching object in the touch detecting area, it records coordinates of infrared light-emitting diodes and infrared receiving diodes corresponding to the blocked infrared light.

This step may be performed by the touch screen as shown in FIG. 4. If there is no infrared light blocked when the touch screen turns on infrared light $i_1 r_p, i_2 r_{p+1}, i_3 r_{p+2} \ldots i_{n+1-p} r_n$, $i_q r_1, i_{q+1} r_2, i_{q+2} r_3 \ldots i_n r_{n+1-q}$ in sequence, it returns to step 1101; if there are infrared light beams $i_3 r_{p+2}, i_{q+4} r_5$ which are blocked, it records coordinates of infrared light-emitting diodes $i_3, i_{q+4}$ and infrared receiving diodes $r_{p+2}, r_5$ corresponding to the blocked infrared light beams $i_3 r_{p+2}, i_{q+4} r_5$.

The process enters into step 1103 of calculating coordinates of intersection of the blocked infrared light, which are just the coordinates of the touching object, and transmitting the coordinate data to a computer for processing.

Figure 10:
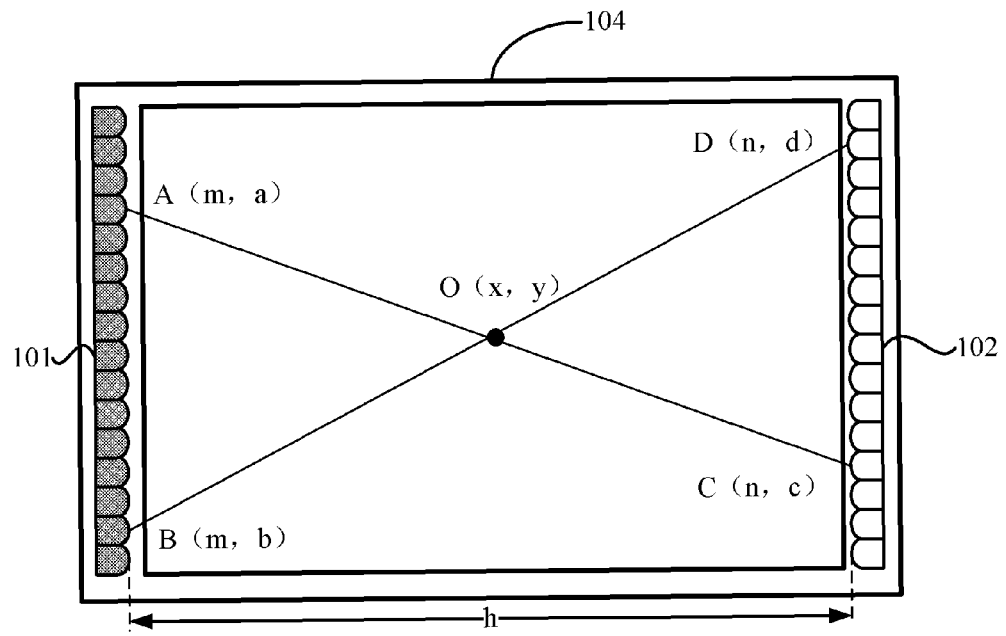
FIG. 10 is a reference diagram of a formula for calculating position of a touching object in the touch positioning method shown in FIG. 9.

Referring to FIG. 10, in step 1103, any two blocked infrared light beams AC, BD are selected from the blocked infrared light beams obtained in step 1101, wherein internal coordinates of the infrared light-emitting diode A corresponding to the blocked infrared light AC are (m, a), internal coordinates of the infrared receiving diode C corresponding thereto are (n, c); internal coordinates of the infrared light-emitting diode B corresponding to the blocked infrared light BD are (m, b), internal coordinates of the infrared receiving diode D corresponding thereto are (n, d), where c−a≠d−b, which means that the AC and BD intersect. By substituting the coordinates A (m, a), C (n, c), B (m, b), D (n, d) of infrared light-emitting diodes and infrared receiving diodes corresponding to the blocked infrared light obtained in the step into the following formulas:

$$x = \frac{an - bn + md - mc}{a - b + d - c}$$

$$y = \frac{ad - bc}{a - b + d - c}$$

the internal coordinates of the intersection of the blocked infrared light AC an BD can be calculated. In order to reduce the calculation amount and to improve the response speed, m is set as 0, which means the straight line where the infrared light-emitting diodes are located is set as y-axis. Meanwhile, it is set n=h, where h is spacing between straight line of the infrared light-emitting diodes and straight line of the infrared receiving diodes. Thus, the formulas above can be simplified into:

$$x = \frac{a - b}{a - b + d - c} h$$

$$y = \frac{ad - bc}{a - b + d - c}$$

Then the coordinate data of the calculated intersection O, i.e. coordinate data of the touching object is transmitted to a computer for processing and making response to the touch operation.

When performing the step by the touch screen as shown in FIG. 4, the coordinates of the infrared light-emitting diodes $i_3(0, 3)$, $i_{q+4}(0, q+4)$ and infrared receiving diodes $r_{p+2}(h, p+2)$, $r_5(h, 5)$ are substituted into the following formulas:

$$x = \frac{a - b}{a - b + d - c} h$$

$$y = \frac{ad - bc}{a - b + d - c}$$

to calculate $$x = \frac{q + 1}{p + q - 2} h,$$

$$y = \frac{(q + 4)(p + 2) - 15}{p + q - 2},$$

and then the coordinates $$\left( \frac{q + 1}{p + q - 2} h, \frac{(q + 4)(p + 2) - 15}{p + q - 2} \right)$$

are transmitted to a computer for processing and making response to the touch operation.

Figure 11:
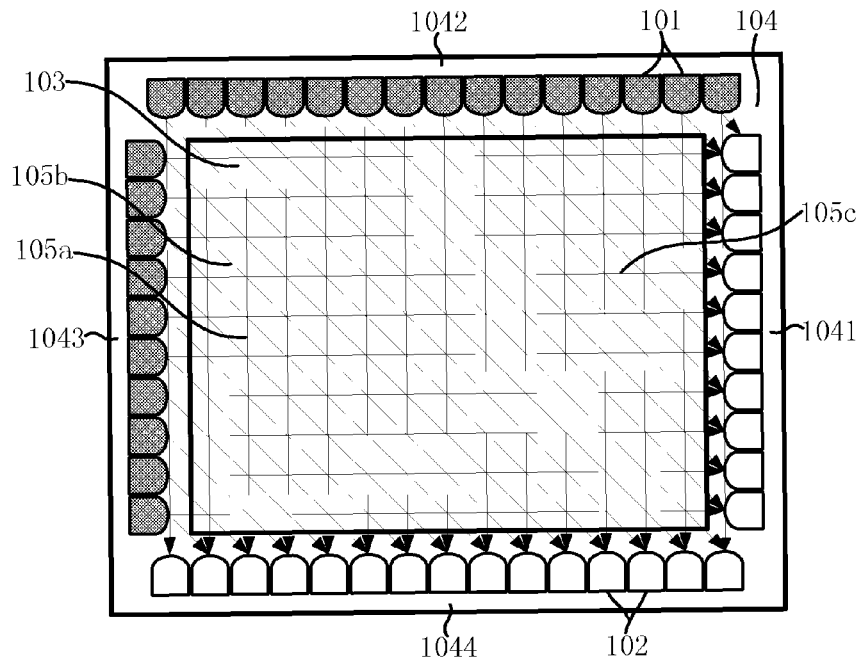
FIG. 11 is a structure diagram of another embodiment of the infrared touch screen according to the present invention.
Figure 12:
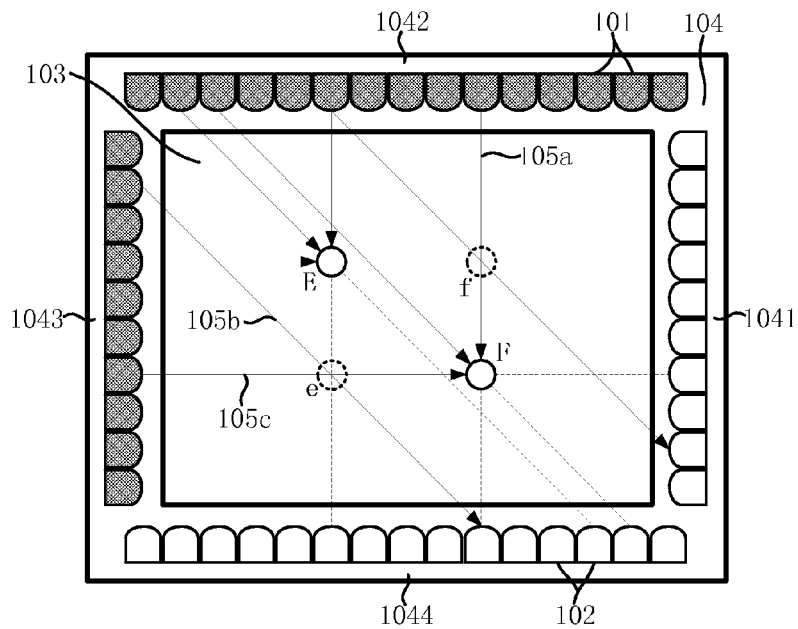
FIG. 12 is a diagram for executing multi-touch of the infrared touch screen shown in FIG. 11.

FIG. 11 shows a structure diagram of another embodiment of the touch screen according to the present invention. The touch screen comprises two sets of infrared light-emitting diodes 101, two sets of infrared receiving diodes 102, a touch detecting area 103 and a rectangular frame 104. The two sets of infrared light-emitting diodes 101 are installed on the second frame edge 1042 and the third frame edge 1043, which are adjacent to each other, of the rectangular frame 104 respectively; the two sets of infrared receiving diodes 102 are installed on the first frame edge 1041 and the fourth frame edge 1044, which are adjacent to each other, of the rectangular frame 104 respectively. At least one infrared light-emitting diode 101 installed on the second frame edge 1042 can emit two beams of infrared light in different directions: infrared light 105a in a first direction and infrared light 105b in a second direction, where the infrared light 105a in the first direction is parallel to the first frame edge 1041 and the third frame edge 1043 and the infrared light 105b in the second direction has an angle of 45° to each of the four frame edges. At least one infrared light-emitting diode 101 installed on the third frame edge 1043 can emit two beams of infrared light in different directions: infrared light 105c in a third direction and infrared light 105b in the second direction, where the infrared light 105c in the third direction is parallel to the second frame edge 1042 and the fourth frame edge 1044 and the infrared light 105b in the second direction has an angle of 45° to each of the four frame edges. The infrared light 105a in the first direction, the infrared light 105b in the second direction and the infrared light 105c in the third direction are received by the infrared receiving diodes 102 installed on the first frame edge 1041 and the fourth frame edge 1044 after passing through the touch detecting area 103. All the infrared light form a crossing infrared light grid within the touch detecting area, and a touch screen of this structure can execute multi-touch detection. As shown in FIG. 12, when there are touching objects E and F in the touch detecting area 103 of the touch screen as shown in FIG. 11, the infrared light 105a in the first direction and the infrared light 105c in the third direction are turned on in sequence, and four touch points E, e, F and f are obtained; then the infrared light 105b in the second direction are turned on in sequence to exclude false touch points e and f so as to obtain coordinates of true touch points E and F to execute a multi-touch. The touch screen as shown in FIG. 11 only shows a preferable embodiment; however, infrared light-emitting diodes which emit a plurality of beams of infrared light can also be installed only on one frame edge, and common infrared light-emitting diodes which emit only one beam of infrared light are installed on the adjacent frame edge. The multi-touch detection can be executed as long as every effective position within the touch detecting area can be scanned by infrared light in at least three directions.

It shall be noted, as to installing manner of infrared light-emitting diodes and infrared receiving diodes, description and figures of the embodiments and improved schemes only show a common installing manner of infrared touch screen according to the present invention, and protection scope of the present invention is not limited to this. In fact, the design solution proposed in the present invention which makes it possible that at least two beams of infrared light in different directions can be emitted requiring only one core by improving the structure of packaging body in the infrared light-emitting diodes can also be applied to infrared touch screen of other structures which can execute or assist object positioning by using infrared light-emitting diodes and infrared receiving diodes, mixed touch screen (such as touch screens like optical touch screen, capacitive touch screen, resistive touch screen which have infrared light-emitting diodes and infrared receiving diodes) or other types of human-computer interactive devices based on the infrared touch screen and mixed touch screen above (such as ATM, interactive display).

Figure 13:
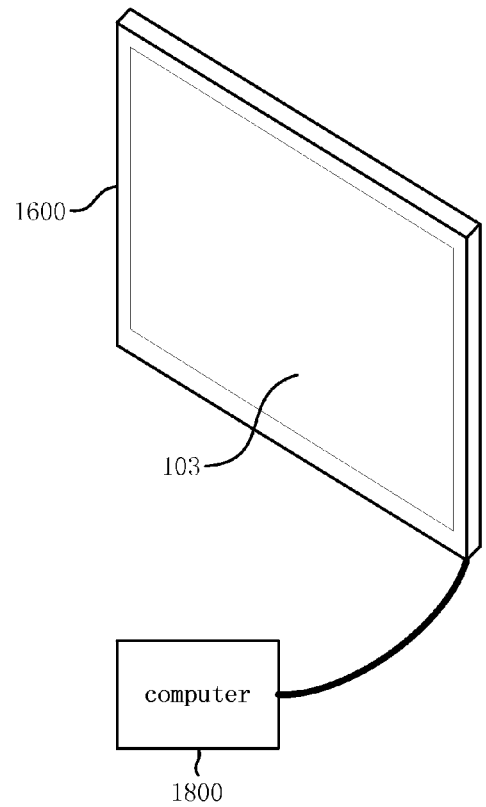
FIG. 13 is a diagram of a touch system of the present invention.

The present invention further provides a touch system which comprises the touch screen above. FIG. 13 shows a diagram of an embodiment of the touch system. The touch system at least comprises a touch screen 1600 and a computer 1800 connected thereto. A user can control the computer 1800 to execute one or more applications by performing a touch operation within a touch detecting area 103 of the touch screen 1600. The touch system can be applied in human-computer interactive devices such as ATM and subway self-service etc.

Figure 14:
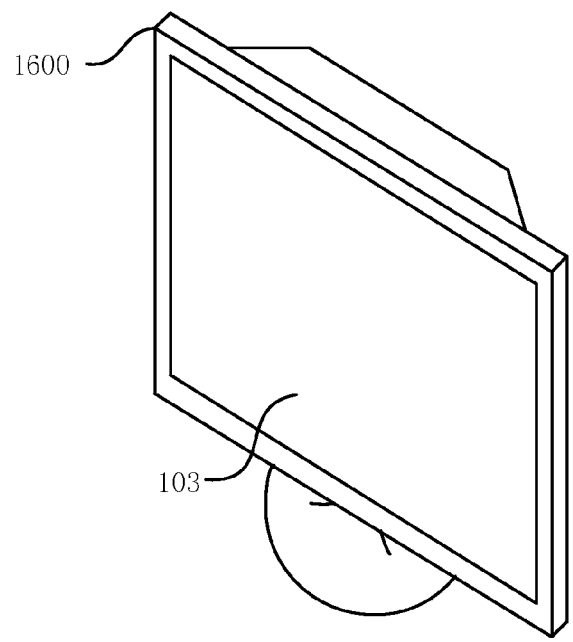
FIG. 14 is a stereoscopic diagram of an interactive display of the present invention.
Figure 15:
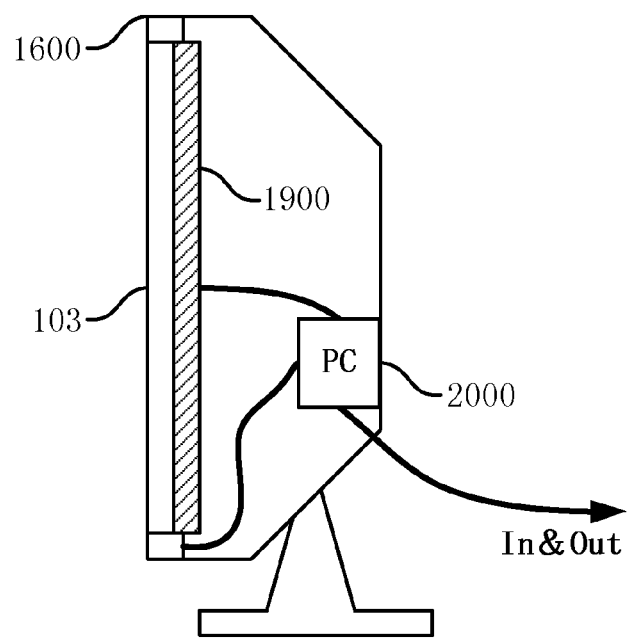
FIG. 15 is a simple profile of the interactive display shown in FIG. 14.

The present invention further provides an interactive display which comprises the infrared touch screen above and a display panel for displaying images. FIGS. 14 and 15 show simple diagrams of an embodiment of the interactive display. The interactive display comprises a touch screen 1600, a display panel 1900 and a general computing device in form of a regular built-in PC 2000. The touch screen 1600 is in front of the display panel 1900 (in the user-oriented direction). The PC 2000 is connected to the touch screen 1600 and the display panel 1900 respectively, and the PC 2000 can also be connected to other computers, video input devices (such as a VCD, DVD etc.) or peripheral equipments (such as a loudspeaker, a printer etc.). The interactive display has functions of video output and optical input. The display panel 1900 can be used to provide various displays and to interact with a user concerning information input and control of software programs. The display panel 1900 can be implemented as a liquid crystal display panel (LCD) or an organic optical display panel, and the touch detecting area 103 of the touch screen 1600 shall be made of transparent materials such as glass and acryl.

Though the embodiments of the present invention have been explained and described in detail, those skilled in the art shall appreciate that these embodiments can be varied without deviating from spirit and principles of the present invention, and scope of the present invention is defined in claims.

The invention claimed is:

1. An infrared light-emitting diode, characterized in that it comprises:
    only one core for emitting infrared light;
    a packaging body outside the core, the packaging body at least comprising a first surface and a second surface, the first surface being convex and in front of the core, and the second surface being plane and on one side of the core; and
    leads connected to the core and extending to outside of the packaging body;
    wherein the infrared light emitted by the core forms at least two beams of infrared light in different directions after being emitted from the packaging body at least through the first surface and the second surface,
    characterized in that the packaging body further has a third surface that is plane, wherein the third surface and the second surface are located on two sides of the core respectively;
    the packaging body further has a fourth surface that is located between the first surface and the second surface or the third surface, wherein the infrared light incident on and fully-reflected at the second surface or the third surface is emitted from the packaging body after being refracted by the fourth surface.

2. The infrared light-emitting diode according to claim 1, characterized in that the at least two beams of infrared light in different directions comprises two beams of infrared light in a first direction and a beam of infrared light in a second direction;
    a part of the infrared light emitted by the core forms a beam of the infrared light in the first direction after being refracted by the first surface;
    a part of the infrared light emitted by the core is fully-reflected at the third surface and emitted toward the fourth surface, and forms another beam of the infrared light in the first direction after being refracted by the fourth surface; and
    a part of the infrared light emitted by the core is fully-reflected at the second surface and emitted toward the first surface, and forms the infrared light in the second direction after being refracted by the first surface.

3. The infrared light-emitting diode according to claim 1, characterized in that the at least two beams of infrared light in different directions comprises two beams of infrared light in a first direction and a beam of infrared light in a third direction;
    a part of the infrared light emitted by the core forms a beam of the infrared light in the first direction after being refracted by the first surface;
    a part of the infrared light emitted by the core is fully-reflected at the second surface and emitted toward the fourth surface, and forms another beam of the infrared light in the first direction after being refracted by the fourth surface; and
    a part of the infrared light emitted by the core is fully-reflected at the third surface and emitted toward the first surface, and forms the infrared light in the third direction after being refracted by the first surface.

4. The infrared light-emitting diode according to claim 1, characterized in that the at least two beams of infrared light in different directions at least comprises infrared light in a first direction and infrared light in a third direction;
    a part of the infrared light emitted by the core forms the infrared light in the first direction after being refracted by the first surface;
    a part of the infrared light emitted by the core is fully-reflected at the third surface and emitted toward the first surface, and forms the infrared light in the third direction after being refracted by the first surface.

5. The infrared light-emitting diode according to claim 1, characterized in that the at least two beams of infrared light in different directions at least comprises infrared light in a first direction, infrared light in a second direction and infrared light in a third direction;
    a part of the infrared light emitted by the core forms the infrared light in the first direction after being refracted by the first surface;
    a part of the infrared light emitted by the core is fully-reflected at the second surface and emitted toward the first surface, and forms the infrared light in the second direction after being refracted by the first surface; and
    a part of the infrared light emitted by the core is fully-reflected at the third surface and emitted toward the first surface, and forms the infrared light in the third direction after being refracted by the first surface.

6. The infrared light-emitting diode according to claim 5, characterized in that the angle between the infrared light in the first direction and the infrared light in the third direction is equal to the angle between the infrared light in the second direction and the infrared light in the third direction.

7. The infrared light-emitting diode according to claim 1, characterized in that a reflecting layer and/or a light absorbing layer is/are set on the outer side of the second surface and/or the third surface.

8. The infrared light-emitting diode according to claim 1, characterized in that optical axis of the core is not parallel to the second surface and/or the third surface.

9. A touch screen, comprising an infrared light-emitting diode, an infrared receiving diode, a touch detecting area and a processing circuit, characterized in that the infrared light-emitting diode comprises:
    only one core for emitting an infrared light;
    a packaging body outside the core, the packaging body at least comprising a first surface and a second surface, the first surface being convex and in front of the core, and the second surface being plane and on one side of the core; and leads connected to the core and extending to outside of the packaging body;

wherein the infrared light emitted by the core forms at least two beams of infrared light in different directions after being emitted from the packaging body at least through the first surface and the second surface, and the at least two beams of infrared light in different directions are received by the infrared receiving diode after passing through the touch detecting area, characterized in that the packaging body further has a third surface that is plane, wherein the third surface and the second surface are located on two sides of the core respectively;

the packaging body further has a fourth surface that is located between the first surface and the second surface or the third surface, wherein the infrared light incident on and fully-reflected at the second surface or the third surface is emitted from the packaging body after being refracted by the fourth surface.

10. The touch screen according to claim 9, characterized in that the at least two beams of infrared light in different directions comprises two beams of infrared light in a first direction and a beam of infrared light in a second direction;

a part of the infrared light emitted by the core forms a beam of the infrared light in the first direction after being refracted by the first surface;

a part of the infrared light emitted by the core is fully-reflected at the third surface and emitted toward the fourth surface, and forms another beam of the infrared light in the first direction after being refracted by the fourth surface; and a part of the infrared light emitted by the core is fully-reflected at the second surface and emitted toward the first surface, and forms the infrared light in the second direction after being refracted by the first surface.

11. The touch screen according to claim 9, characterized in that the at least two beams of infrared light in different directions comprises two beams of infrared light in a first direction and a beam of infrared light in a third direction;

a part of the infrared light emitted by the core forms a beam of the infrared light in the first direction after being refracted by the first surface;

a part of the infrared light emitted by the core is fully-reflected at the second surface and emitted toward the fourth surface, and forms another beam of the infrared light in the first direction after being refracted by the fourth surface; and a part of the infrared light emitted by the core is fully-reflected at the third surface and emitted toward the first surface, and forms the infrared light in the third direction after being refracted by the first surface.

12. The touch screen according to claim 9, characterized in that the at least two beams of infrared light in different directions at least comprises infrared light in a first direction and infrared light in a third direction;

a part of the infrared light emitted by the core forms the infrared light in the first direction after being refracted by the first surface;

a part of the infrared light emitted by the core is fully-reflected at the third surface and emitted toward the first surface, and forms the infrared light in the third direction after being refracted by the first surface.

13. The touch screen according to claim 9, characterized in that the at least two beams of infrared light in different directions at least comprises infrared light in a first direction, infrared light in a second direction and infrared light in a third direction;

a part of the infrared light emitted by the core forms the infrared light in the first direction after being refracted by the first surface;

a part of the infrared light emitted by the core is fully-reflected at the second surface and emitted toward the first surface, and forms the infrared light in the second direction after being refracted by the first surface; and a part of the infrared light emitted by the core is fully-reflected at the third surface and emitted toward the first surface, and forms the infrared light in the third direction after being refracted by the first surface.

14. The infrared light-emitting diode according to claim 1, characterized in that a reflecting layer and/or a light absorbing layer is/are set on the outer side of the second surface and/or the third surface.

15. The infrared light-emitting diode according to claim 1, characterized in that optical axis of the core is not parallel to the second surface and/or the third surface.

* * * * *